US008012820B2

(12) United States Patent
Majumdar et al.

(10) Patent No.: US 8,012,820 B2
(45) Date of Patent: Sep. 6, 2011

(54) ULTRA-THIN SOI CMOS WITH RAISED EPITAXIAL SOURCE AND DRAIN AND EMBEDDED SIGE PFET EXTENSION

(75) Inventors: Amlan Majumdar, White Plains, NY (US); Gen Pei, Yorktown Heights, NY (US); Zhibin Ren, Hopewell Junction, NY (US); Dinkar Singh, Chicago, IL (US); Jeffrey W. Sleight, Ridgefield, CT (US)

(73) Assignees: International Business Machines Corporation, Armonk, NY (US); Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/052,702

(22) Filed: Mar. 21, 2011

(65) Prior Publication Data
US 2011/0165739 A1    Jul. 7, 2011

Related U.S. Application Data

(60) Continuation of application No. 12/535,306, filed on Aug. 4, 2009, which is a division of application No. 11/684,122, filed on Mar. 9, 2007, now abandoned.

(51) Int. Cl.
*H01L 21/8238*    (2006.01)

(52) U.S. Cl. .................. 438/199; 438/300; 257/E21.632
(58) Field of Classification Search .................. 438/197, 438/199, 230, 300; 257/E21.619, E21.632, 257/E21.634
See application file for complete search history.

(56) References Cited

U.S. PATENT DOCUMENTS

| 6,939,751 | B2 | 9/2005 | Zhu et al. |
| 7,611,938 | B2 * | 11/2009 | Cheng et al. .................. 438/199 |
| 2005/0093021 | A1 | 5/2005 | Ouyang et al. |
| 2005/0093075 | A1 | 5/2005 | Bentum et al. |
| 2005/0112857 | A1 | 5/2005 | Gluschenkov et al. |
| 2006/0175659 | A1 | 8/2006 | Sleight |

* cited by examiner

*Primary Examiner* — Hoai v Pham
(74) *Attorney, Agent, or Firm* — Scully, Scott, Murphy & Presser, P.C.; Vazken Alexanian

(57) ABSTRACT

A method for improving channel carrier mobility in ultra-thin Silicon-on-oxide (UTSOI) FET devices by integrating an embedded pFET SiGe extension with raised source/drain regions. The method includes selectively growing embedded SiGe (eSiGe) extensions in pFET regions and forming strain-free raised Si or SiGe source/drain (RSD) regions on CMOS. The eSiGe extension regions enhance hole mobility in the pFET channels and reduce resistance in the pFET extensions. The strain-free raised source/drain regions reduce contact resistance in both UTSOI pFETs and nFETs.

13 Claims, 4 Drawing Sheets

ULTRA-THIN SOI CMOS WITH RAISED EPITAXIAL SOURCE AND DRAIN AND EMBEDDED SIGE PFET EXTENSION

RELATED APPLICATIONS

This application is a continuation application of U.S. application Ser. No. 12/535,306, filed Aug. 4, 2009; which is a divisional of U.S. application Ser. No. 11/684,122, filed Mar. 9, 2007.

BACKGROUND

The present invention related generally to the fabrication of complementary metal oxide semiconductor (CMOS) field effect transistors (FET), and more particularly, to a method for forming ultra-thin SOI (UTSOI) field effect transistors with stressed channel regions which provide increased carrier mobility among other benefits.

CMOS FETs are employed in almost every electronic circuit application such as signal processing, computing, and wireless communications. It has been demonstrated that ultra-thin SOI (UTSOI) FETs have a very good short channel control due to extremely thin channel region. Thin body devices however, lead to high series resistance Rext, which can be mitigated by forming raised source/drain (RSD) regions. It has also been demonstrated however, that thick channel SOI FETs exhibit improved FET performance such as switching speed and drive current, by applying stress in the channel. The improvement stems from enhanced carrier mobility in stressed FET channels.

Incorporating stress into UTSOI FETs is a challenge because of the thin channel region.

Commonly-owned, co-pending United States Patent Publication No. US20060175659A1 appears to describe a substrate having an UTSOI region and a bulk-Si region, and, in particular, forming of nFET and pFET devices on UTSOI.

Commonly-owned, co-pending United States Patent Publication No. US20050093021A1 describes a strained SiGe layer epitaxially grown on the Si body serving as a buried channel for holes, a Si layer epitaxially grown on the SiGe layer serving as a surface channel for electrons, and a source and a drain containing an epitaxially deposited, strained SiGe of opposing conductivity type than the Si body.

Commonly-owned U.S. Pat. No. 6,939,751 describes a (Raised Source Drain) RSD FET device with a recessed channel is formed with a raised silicon sources and drains and a gate electrode structure formed on an SOI structure (a Si layer formed on a substrate).

None of this prior art however, addresses the integration of an embedded pFET SiGe extension with raised source/drain regions.

It would thus be highly desirable to provide a method of making UTSOI CMOS devices where the PFET has an embedded SiGe extensions region and, where both NFETs and PFETs have raised source/drain structures.

SUMMARY

The present invention provides a novel semiconductor device structure that includes integrating embedded PFET devices with a SiGe extension with raised CMOS source drain regions. Particularly, according to the invention, epitaxially grown raised source and drain structures are formed to reduce contact and source/drain resistance. Additionally, implemented are the embedded SiGe extensions to improve the PFET device extension and channel region conductivity.

The present invention provides a methodology that includes selectively growing embedded SiGe (eSiGe) extensions in pFET regions and forming strain-free raised Si or SiGe source/drain (RSD) regions on CMOS. The eSiGe extension regions enhance hole mobility in the pFET channels and reduce resistance in the pFET extensions. The strain-free raised source/drain regions reduce contact resistance in both UTSOI pFETs and nFETs.

Thus, according to one aspect of the invention, there is provided a novel PFET transistor device comprising:

a semiconductor substrate having a buried layer of insulator material formed therein and an Ultra-thin Silicon On Insulator (UTSOI) layer formed a top said buried layer of insulator material, said UTSOI layer providing an active area for a PFET device;

a gate structure including a gate dielectric layer formed in said UTSOI active area for said PFET device and a gate electrode conductor formed atop said gate dielectric layer;

epitaxially grown embedded semiconductor extensions formed in respective recesses created as a result of removing portions of the UTSOI layer at respective source region and drain region at each side of said gate structure of said PFET device; and, raised source/drain (RSD) structures on top of respective epitaxially grown embedded semiconductor extensions, wherein said epitaxially grown embedded semiconductor PFET extensions create compressive stress in the UTSOI layer thereby enhancing PFET device performance.

According to this aspect of the invention, a thickness of the UTSOI layer ranges between 10 Å to about 300 Å. It is further understood that an n-well structure is formed in the UTSOI regions for the PFET device.

Preferably, each of the formed RSD structures are distanced from a gate edge by a distance sufficient to lower parasitic capacitance between the gate and the respective source/drain. This distance may range between 30 nm-40 nm distance corresponding to the thickness of formed thick disposable sidewall spacers at sidewalls of said gate electrode prior to forming the raised RSD structures.

According to another aspect of the invention, there is provided a novel method of forming a PFET transistor device comprising:

a) forming an Ultra-thin Silicon On Insulator (UTSOI) layer a top a buried layer of insulator material within a semiconductor substrate, said UTSOI layer providing an active area for a PFET device;

b) forming atop said UTSOI active area a gate structure for said PFET device, said gate structure including a gate dielectric layer formed atop said UTSOI active layer and a corresponding gate conductor formed atop said gate dielectric layer;

c) removing portions of the UTSOI layer at respective source region and drain region at each side of said gate electrode of said PFET device to create a respective recess at the active UTSOI area while leaving said UTSOI layer under said gate electrode defining a gate channel region for the PFET device;

d) epitaxially growing embedded semiconductor extensions in each respective recess corresponding to said source and drain regions of the PFET device; and e) forming thick disposable sidewall spacers at sidewalls of said gate electrode of said PFET device;

f) forming raised source/drain (RSD) structures on top of respective epitaxially grown embedded semiconductor extensions corresponding to said source and drain regions of the PFET device; and, g) removing said thick disposable sidewall spacers at said PFET device, wherein said epitaxially grown embedded semiconductor extensions create compressive stress in the thin SOI layer thereby enhancing device performance.

Preferably, each of the formed RSD structures are distanced from a gate edge by a distance sufficient to lower parasitic capacitance between the gate and the respective source/drain. This distance may range between 30 nm-40 nm distance corresponding to the thickness of formed thick disposable sidewall spacers at sidewalls of said gate electrode prior to forming the raised RSD structures.

BRIEF DESCRIPTION OF THE DRAWINGS

The objects, features and advantages of the present invention will become apparent to one skilled in the art, in view of the following detailed description taken in combination with the attached drawings, in which.

DETAILED DESCRIPTION

The present invention is directed to a method for forming ultra-thin SOI (UTSOI) field effect transistors with stressed channel regions that provide increased carrier mobility.

Figure 1:
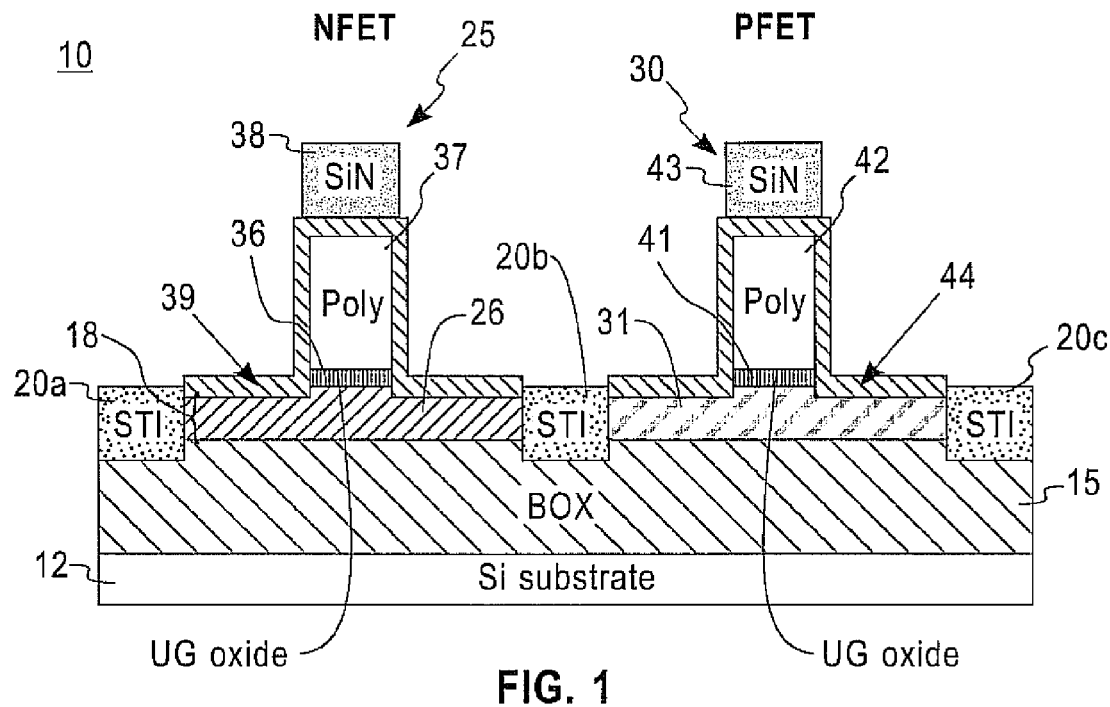
FIG. 1 depicts, through cross-sectional view, a resulting intermediate semiconductor structure after applying processing steps for forming NFET gate electrode and PFET gate electrode structures fabricated on an SOI structure including a buried oxide (BOX) region.

FIG. 1 shows, through cross-sectional view, a semiconductor structure 10 resulting from conventional UTSOI processing. As shown, in FIG. 1, there is first fabricated an SOI structure including a buried oxide (BOX) region 15 (e.g., an oxide, nitride, oxynitride or any combination thereof, with an oxide such as $SiO_2$ being most typical) that is located between a top Si-containing layer 18 and a bottom Si-containing layer 12. Preferably, the BOX region 15 is continuous. The thickness of the BOX region 15 formed in the present invention may vary depending upon the exact embodiments and conditions used in fabricating the same. Typically, however, the BOX region has a thickness from about 200 to about 1800 Å, with a BOX thickness from about 1300 to about 1600 Å being more typical.

Insofar as the top Si-containing layer 18 of the SOI substrate 10 is concerned, that Si-containing layer may have a variable thickness, which is also dependent on the embodiment and conditions used in fabricating the SOI substrate. Typically, however, the top Si-containing layer 18 of the SOI substrate 10 has a thickness from about 10 to about 1000 Å, with a top Si-containing layer thickness from about 200 to about 700 Å being more typical. According to the invention, the ultra-thin SOI layer 18 is of a thickness ranging between 10 and 300 Å. The thickness of the bottom Si-containing layer 12 of the SOI substrate 10 is inconsequential to the present invention.

The UTSOI substrate of the present invention can be used in forming high-performance semiconductor devices or circuits. Examples of such devices or circuits that can contain the SOI substrate of the present invention include, but are not limited to: microprocessors, memory cells such as dynamic random access memory (DRAM) or static random access memory (SRAM), application specific integrated circuits (ASICs), optical electronic circuits, and larger and more complicated circuits. Since these devices or circuits are well known to those skilled in the art, it is not necessary to provide a detail description concerning the same herein. It is however emphasized that the active devices and/or circuits of such semiconductor devices and circuits are typically formed in the top Si-containing layer of the UTSOI substrate. The invention is described hereinafter with respect to forming NFET device 25 and PFET device 30 formed in the top Si-containing layer of the SOI substrate.

The term "Si-containing" when used in conjunction with layers 12 and 18 denotes any semiconductor material that includes silicon therein. Illustrative examples of such Si-containing materials include but are not limited to: Si, SiGe, SiGeC, SiC, Si/Si, Si/SiGe, preformed SOI wafers, silicon germanium-on-insulators (SGOI) and other like semiconductor materials. The preformed SOI wafers and SGOI wafers, which can be patterned or unpatterned, may also include a single or multiple buried oxide regions formed therein. The Si-containing material can be undoped or doped (p or n-doped) depending on the future use of the SOI substrate.

As part of the conventional UTSOI processing, the SOI layer 18 is thinned using oxidation and wet etch techniques. After forming the ultra-thin SOI layer 18, very thin pad oxidation and pad nitride layers are deposited and via lithographic techniques, the active UTSOI areas 26, 31 for respective NFET device 25 and PFET transistor device 30 are defined. That is, a lithographic mask is patterned and formed over the top SOI layer 18 to expose regions for forming shallow trench isolation (STI) structures. This processing includes applying a photoresist to the surface of the SOI substrate 18, exposing the photoresist and developing the exposed photoresist using a conventional resist developer. The etching step used in forming the STI trenches includes any standard Si directional reactive ion etch process. Other dry etching processes such as plasma etching, ion beam etching and laser ablation, are also contemplated herein. The etch can be stopped on the top of the thick BOX layer 15 with no more than 50 Å BOX loss. The STI regions 20a, 20b and 20c are then formed, e.g., by depositing an STI oxide, e.g., SiO$_2$ in the formed trenches, annealing and chemical mechanical polishing (CMP) the resultant structure. These STI regions isolate the NFET 25 and PFET 30 devices to be formed.

Continuing, further processing steps are performed for forming the NFET 25 and PFET 30 devices including: preparing a top-contact to back Si substrate formation. This may be achieved, for example, by the following steps: (i) blanket nitride deposition, (ii) lithographically defining contact areas on STI oxide regions, (iii) a thin nitride RIE followed by a deep oxide RIE to create a trench all the way down to the Si substrate 12, (iv) resist strip, (v) thick poly silicon deposition, and (vi) poly silicon CMP that stops on the thin nitride layer, performing an STI deglaze to strip the previously formed pad nitride and pad oxide layers (not shown) [pad nitride is stripped using hot phosphoric acid and then pad oxide is removed using hydrofluoric acid], forming a sacrificial oxidation (sacox) layer to screen well implants for each device, and performing an ion implantation step for forming CMOS wells by: (i) lithographically defining NFET areas 26, (ii) p-type ion implants into 26, examples are Boron, BF2, or Indium, (iii) resist strip, (iv) lithographically defining PFET areas 31, (v) n-type ion implants into 31, such as Arsenic, Phosphorus, or Antimony, and (vi) resist strip. The CMOS well implant, which typically forms a well region within the SOI layer 18, is carried out using a conventional ion implantation process well known to those skilled in the art. P- or N-type dopants can be used in forming the well region. For example, for the NFET, a p-well may be fabricated in the active UTSOI area 26 for the NFET, an n-well may be fabricated in the active UTSOI area 31 for the PFET. After ion implantation, wafers are subjected to rapid thermal annealing to remove implant damage. After forming CMOS NFET and PFET p-well and n-well structures, respectively, a step is performed for stripping the sacrificial oxidation layer. Then, a gate dielectric step is performed for forming the respective gate dielectric layers 36, 41 for each respective NFET 25 and PFET 30 device.

The gate dielectric layers 36, 41 for each of the respective NFET 25 and PFET 30 devices may comprise conventional dielectric materials such as oxides, nitrides and oxynitrides of silicon that have a dielectric constant from about 4 (i.e., typically a silicon oxide) to about 8 (i.e., typically a silicon nitride), measured in vacuum. Alternatively, the gate dielectric 14 may comprise generally higher dielectric constant dielectric materials having a dielectric constant from about 8 to at least about 100. Such higher dielectric constant dielectric materials may include, but are not limited to hafnium oxides, hafnium silicates, zirconium oxides, lanthanum oxides, titanium oxides, barium-strontium-titantates (BSTs) and lead-zirconate-titanates (PZTs). The gate dielectrics 36, 41 for each of the respective NFET 25 and PFET 30 devices may be formed using any of several methods that are appropriate to its material of composition. Non-limiting examples include thermal or plasma oxidation or nitridation methods, chemical vapor deposition methods (including atomic layer deposition methods) and physical vapor deposition methods. Typically, the gate dielectric layers 36, 41 for each of the NFET 25 and PFET 30 devices comprise a thermal silicon oxide dielectric material that has a thickness from about 10 to about 30 angstroms.

Continuing, there is next formed the gate electrodes 37, 42 for each respective NFET 25 and PFET 30 devices. The gate electrodes 37, 42 may comprise materials including but not limited to certain metals, metal alloys, metal nitrides and metal silicides, as well as laminates thereof and composites thereof. The gate electrodes 37, 42 may also comprise doped polysilicon and polysilicon-germanium alloy materials (i.e., having a dopant concentration from about 1e19 to about 1e22 dopant atoms per cubic centimeter) and polycide materials (doped polysilicon/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, the gate electrodes 37, 42 each comprise a doped polysilicon material that has a thickness from about 500 to about 1500 angstroms. The NFET gate polysilicon is then doped with n-type dopants (As or P or Sb) and the PFET gate polysilicon with p-type dopants (B or BF$_2$ or In). Selective doping is achieved using photolithography to cover one type of FETs while exposing the other to ion implants.

In a further processing step, capping layers 38, 43 for respective gate devices 25 and 30 are formed that comprises a capping material that in turn typically comprises a hard mask material. This hard mask material is required for selective Si or SiGe epitaxy that is performed later. Without the hard mask, Si or SiGe also gets deposited on the gate polysilicon and causes a gate mushroom that could come in physical contact with the raised source/drain, thereby, causing gate-to-source and/or gate-to-drain shorts. Dielectric hard mask materials are most common but by no means limit the instant embodiment or the invention. Non-limiting examples of hard mask materials include oxides, nitrides and oxynitrides of silicon. Oxides, nitrides and oxynitrides of other elements are not excluded. The capping material may be formed using any of several methods that are conventional in the semiconductor fabrication art. Non-limiting examples include chemical vapor deposition methods and physical vapor deposition methods. Preferably, a silicon nitride (SiN) and high-temperature oxide (HTO) hard mask deposition is performed to cap the gate polysilicon for raised source/drain (RSD) integration. Using typical gate lithography and etch techniques, the gate devices 25 and 30 result having a respective SiN cap 38, 43 formed on top. These respective SiN capping layers 38, 43 have a thickness from about 100 to about 500 angstroms.

In a further processing step such as shown in FIG. 1, each of the respective gate devices 25 and 30 are re-oxidized (ReOx) such that a thin layer of dielectric material, e.g., an oxide, is formed to cover each gate electrode structure. Thus, as shown in FIG. 1, NFET 25 includes a thin layer 39 of oxide, while PFET 30 includes a thin layer 44 of oxide. There is no re-oxide material layers 39 and 44 on the respective top cap layers 38, 43 as shown in FIG. 1 because only exposed Si or polysilicon is oxidized while nitride is not.

Figure 2:
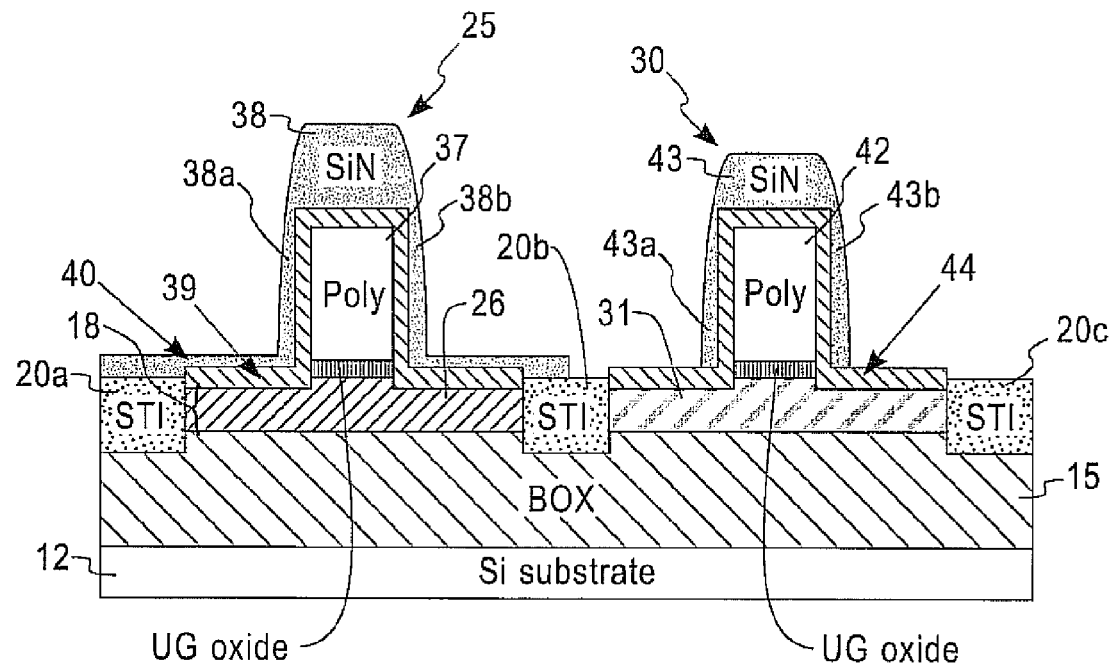
FIG. 2 illustrates, through cross-sectional view, a resulting intermediate semiconductor structure after applying processing steps for forming thin disposable spacers on each sidewall of the PFET gate electrode and thin disposable cover on the entire NFET structure.

The CMOS structure at this stage is shown in FIG. 1. Continuing to FIG. 2, there is shown the resultant structure after blanket depositing a thin conformal layer 40 of SiN material by low-pressure chemical vapor deposition (LPCVD) over each of the respective devices 25, 30. In one embodiment, the thin conformal layer 40 of SiN material may range up to about 10 nm in thickness. As part of this process, thin disposable spacers are formed on each sidewall of the gate electrodes. For example, this step results in spacers 38a, 38b formed on NFET device 25 in addition to the thin conformal layer 40 of SiN material formed above the ReOx layer 39. In a further processing step, only the NFET device 25 is covered with a resist material and a SiN reactive ion etch (RIE) is performed on the PFET device 30 to form the thin disposable spacers 43a, 43b on PFET device 30. As a result of the etch, the thin conformal thin conformal layer 40 of SiN material is removed form atop the ReOx layer 44 at the PFET device 30. The CMOS structure resulting at this stage is shown in FIG. 2.

Figure 3:
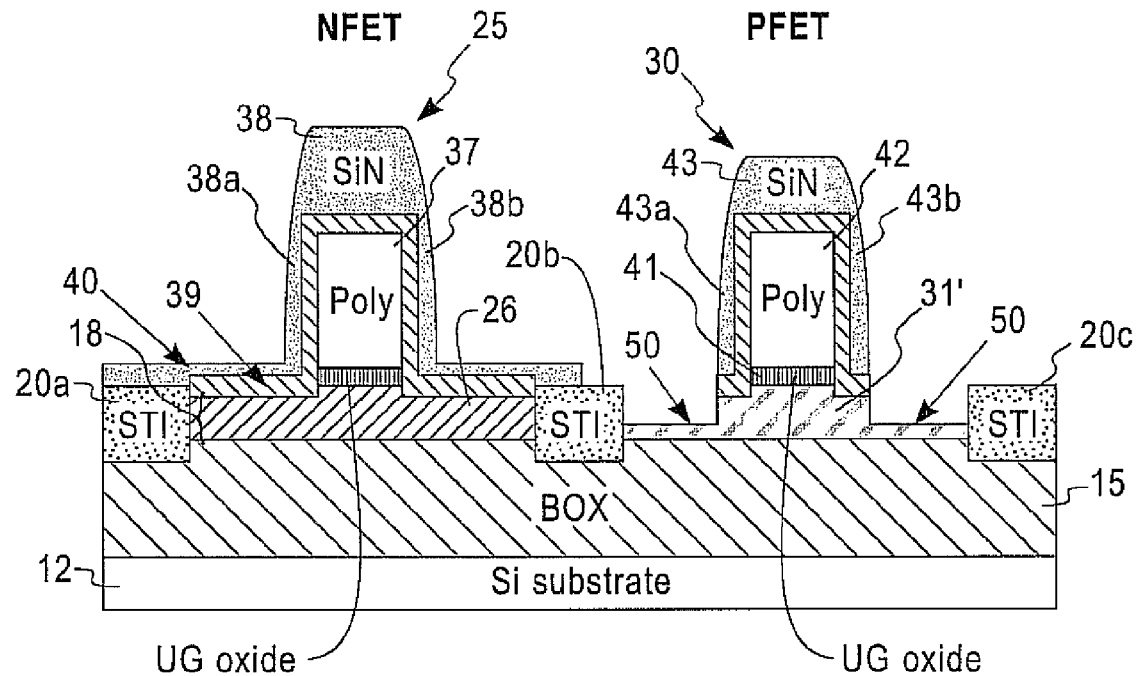
FIG. 3 depicts, through a cross-sectional view, a resulting intermediate semiconductor structure after applying processing steps for creating a recess in the Si active region at the PFET device by removing portions of the SOI layer.

Continuing to FIG. 3, there is shown the resultant structure after creating a recess 50 at the PFET device. That is, as shown in FIG. 3, with the NFET 25 now covered with blanket SiN, a recess is created in the Si active region at the PFET device 30 by removing portions of the SOI layer 31. This may entail pre-cleaning the PFET structure using an hydrofluoric acid (HF) wet etch or RIE chemical oxide removal (COR) dry etch to remove the exposed top ReOx layer 44, applying a furnace oxidation step to consume the underlying Si of the SOI layer 31, and then removing the oxide removal using HF wet etch or RIE COR dry etch. The resultant CMOS structure at this stage is shown in FIG. 3 showing the short SOI channel region 31' underlying the gate oxide of the PFET 30.

Figure 4:
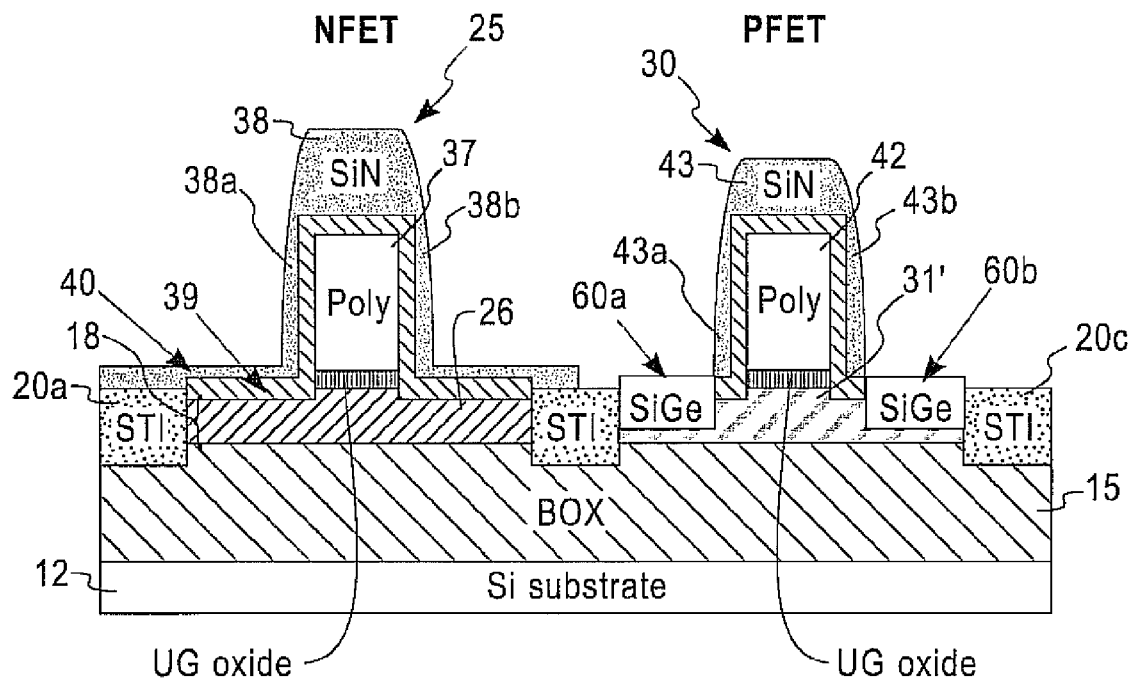
FIG. 4 depicts, through a cross-sectional view, a resulting intermediate semiconductor structure after applying processing steps for epitaxially growing embedded SiGe extensions corresponding to drain and source regions for the PFET device.

Continuing to FIG. 4, with the recessed Si structure 50 at the PFET device 30, a selective epitaxial SiGe growth process is performed at the PFET to create the resulting CMOS structure shown in FIG. 4. In the structure shown in FIG. 4, epitaxially grown SiGe extensions 60a, 60b corresponding drain and source regions are formed for the PFET device 30. The epitaxial method that may be used for forming the embedded SiGe (eSiGe) extensions 60a, 60b in PFET device may use source materials and deposition conditions that are otherwise generally conventional in the semiconductor fabrication art. Preferably, the eSiGe extensions 60a, 60b are formed a few nanometer higher than the short SOI channel region 31' thus maximizing its compressive stress effect.

Figure 5:
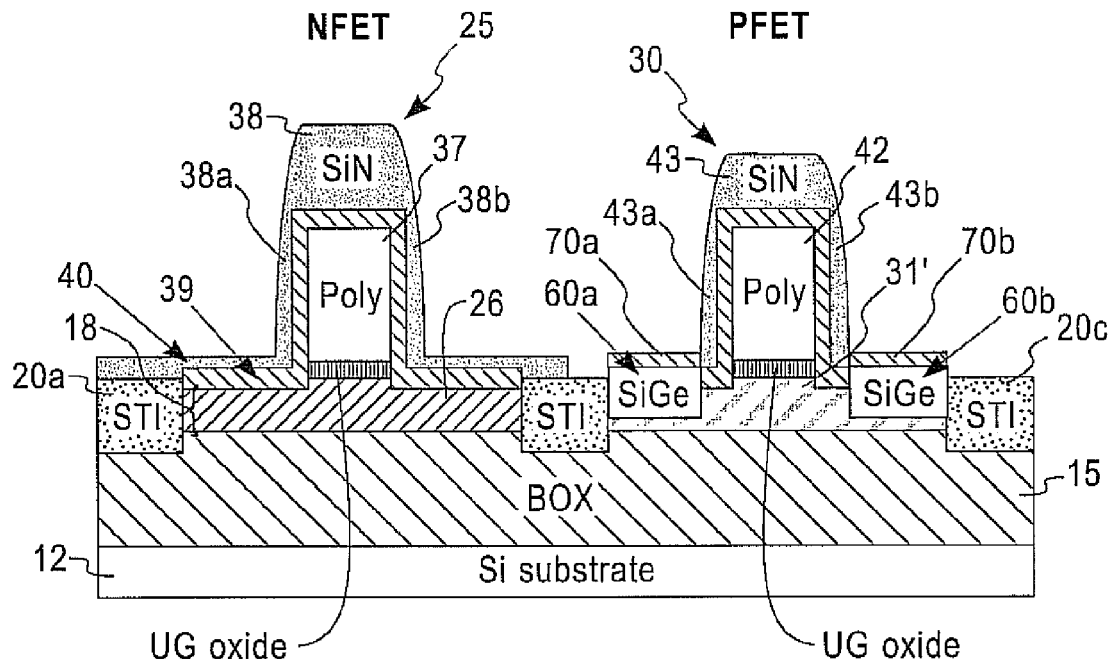
FIG. 5 depicts, through a cross-sectional view, a resulting intermediate semiconductor structure after performing an oxidation step to create a thin layer of oxide on top of the exposed surfaces of the respective eSiGe regions.

Continuing to FIG. 5, an oxidation step is performed to create a thin layer of oxide 70a, 70b on top of the exposed surfaces of the respective eSiGe regions 60a, 60b to create the intermediate CMOS structure shown in FIG. 5. This thin layer of oxide is deposited using conventional deposition techniques such as low-temperature CVD to a thickness ranging between 30 and 100 angstroms. This thin layer of oxide will act as the RIE stop layer for SiN RIE in a subsequent step now described herein with respect to FIG. 6.

Figure 6:
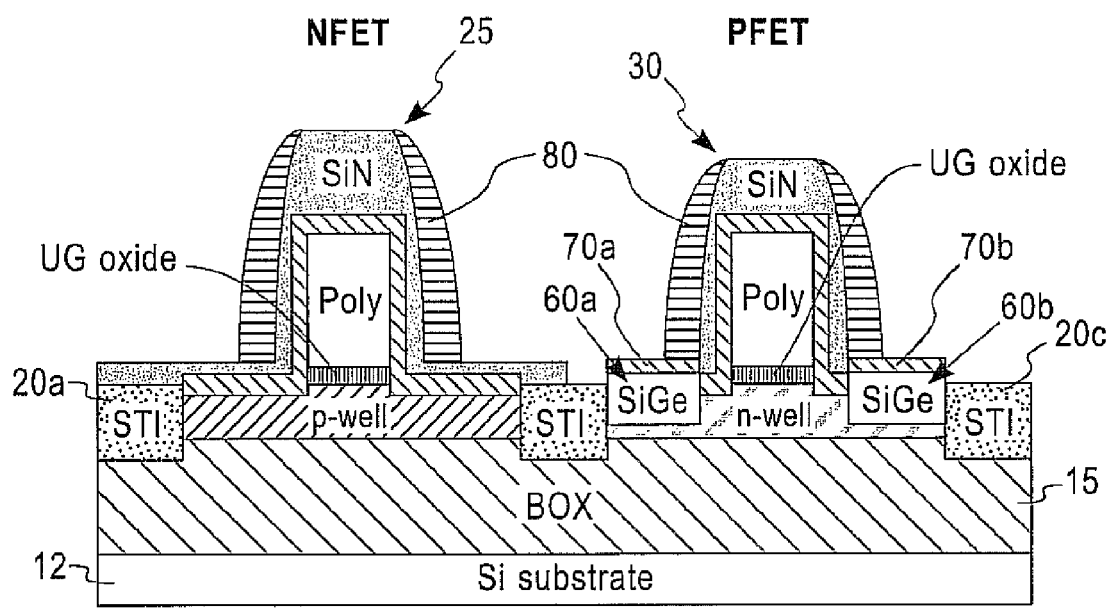
FIG. 6 depicts, through a cross-sectional view, a resulting intermediate semiconductor structure after depositing a SiN layer by LPCVD over both NFET and PFET devices and forming thick SiN disposable spacers at both NFET and PFET devices.

FIG. 6 depicts the resultant structure formed after depositing a SiN layer by LPCVD over both NFET 25 and PFET 30 devices. In one embodiment, the SiN layer is deposited to a thickness ranging from between 30-40 nm thick as this is an optimum range for best ac-performance. That is, if the RSD is too close to the gate, one pays a parasitic capacitance penalty and if the RSD is too far, then one pay a large parasitic resistance penalty. Further, a SiN RIE step is performed to form thick SiN disposable spacers 80 at both NFET 25 and PFET 30 devices as shown in FIG. 6.

Figure 7:
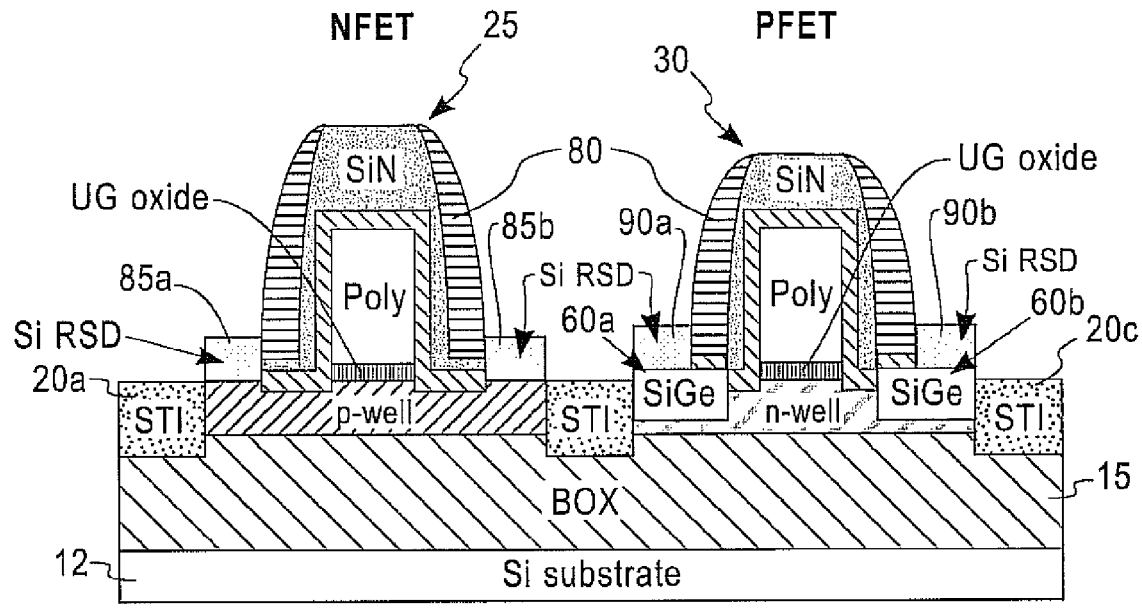
FIG. 7 depicts, through a cross-sectional view, a resulting intermediate semiconductor structure after performing selective epitaxial Si raised source/drain (RSD) regions for each said NFET and PFET device; and, FIG. 8 depicts, through a cross-sectional view, a resulting structure after stripping the SiN disposable spacer from the CMOS structure shown in FIG. 7.

Continuing to FIG. 7, with the thick disposable spacers 80 at both NFET and PFET devices, a selective epitaxial Si raised source/drain (RSD) growth step is performed to create the CMOS structure shown in FIG. 7. As shown in FIG. 7, the raised source/drain (RSD) growth step results in raised source/drain (RSD) structures 85a, 85b of about 100 to 400 angstroms in thickness for NFET device 25 and raised source/drain (RSD) structures 90a, 90b of about 100 to 400 angstroms in thickness for PFET device 30. Each of the formed RSD structures 85a, 85b and 90a, 90b are distanced from the polysilicon gate edge by 30-40 nm distance corresponding to the thickness of the SiN disposable spacers 80. This distance between each formed RSD structure and a respective gate edge is sufficient to lower parasitic capacitance between the gate and the respective source/drain.

Figure 8:
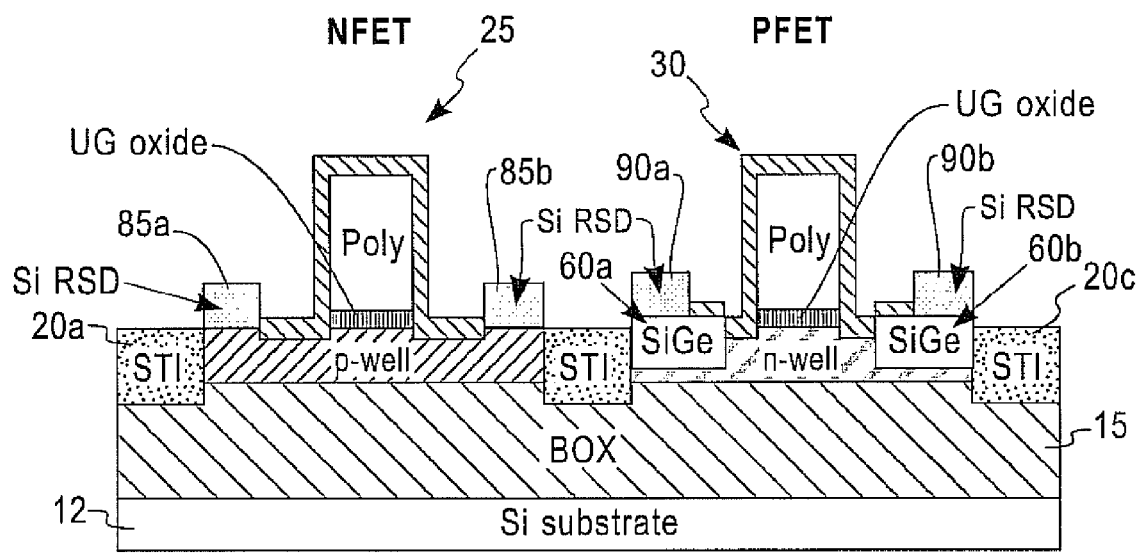

Referring to FIG. 8, the SiN disposable spacer 80 is stripped from the CMOS structure shown in FIG. 7 using hot phosphoric acid or like selective etching material.

From this structure, conventional CMOS processing may continue to finish CMOS FEOL processing including steps such as: halo ion implantation, offset spacer formation, extension ion implantation, final spacer formation, deep S/D ion implantation, deep S/D activation anneals, silicidation, and dual stress liner (DSL) process.

The present invention thus provides a novel semiconductor device structure that includes integrating PFET devices with an embedded SiGe extension coupled with raised CMOS source drain regions. The embedded SiGe extensions particularly help to 1) create compressive stress in the thin SOI layer thereby improving hole mobility (the eSiGe extensions are positioned close to the channel region thereby maximizing its stress effect); 2) minimize dopant (e.g., Boron) loss in extension regions, thereby enhancing extension conductivity; and, 3) for relatively thick SOI or bulk PFETS, the presence of the Ge retards boron diffusion thus enabling a shallow extension junction which is beneficial to short-channel control.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

Having thus described our invention, what we claim as new, and desire to secure by Letters Patent is:

1. A method for forming FET devices comprising:
   a) forming an Ultra-Thin Silicon On Insulator (UTSOI) layer atop a buried layer of insulator material region within a semiconductor substrate,
   b) forming (Shallow Trench Isolation) STI regions to isolate active SOI regions for forming a respective NFET device and PFET device;
   c) forming atop said active UTSOI layer a gate electrode structure for each respective NFET and PFET device in a respective isolated active UTSOI region, said gate including a gate dielectric layer formed atop said active UTSOI layer and a corresponding gate conductor formed atop said gate dielectric layer for each respective NFET and PFET device;
   d) forming thin disposable spacers on each sidewall of the gate electrodes for each respective NFET and PFET device;
   e) removing portions of the UTSOI layer at respective source region and drain region at each side of said gate electrode of said PFET device to create a recess at the active UTSOI region of the PFET device while leaving a thin UTSOI layer under said gate electrode defining a gate channel region for the PFET device;
   f) epitaxially growing embedded semiconductor extensions in each respective recess corresponding to said source and drain regions of the PFET device;
   g) depositing a layer of dielectric material over both NFET and PFET devices;
   h) performing etching of said dielectric layer to form thick disposable gate sidewall spacers at both NFET and PFET devices;
   i) forming raised source/drain (RSD) structures on top of respective epitaxially grown embedded semiconductor extensions of the PFET device and, forming raised source/drain (RSD) structures on top of said UTSOI layer at respective source region and drain region at each side of said gate electrode of said NFET device; and,
   j) removing said thick SiN disposable sidewall spacers at both NFET and PFET devices, wherein said epitaxially grown embedded semiconductor extensions create compressive stress in the UTSOI channel layer of said PFET device thereby enhancing device performance.

2. The method as claimed in claim 1, wherein said STI forming step b) comprises:
   forming STI trenches using lithographic processes; and,
   depositing an STI dielectric material in the formed trenches, annealing and chemical mechanical polishing (CMP) the resultant structure.

3. The method as claimed in claim 2, wherein said STI dielectric material is one of an oxide, nitride or oxynitride material.

4. The method as claimed in claim 2, wherein prior to forming disposable spacers at step d), the steps of:
   forming a capping layer for each respective NFET and PFET gate structure comprising a dielectric capping material; and,
   forming a re-oxidized (ReOx) thin layer of material to cover each gate and respective active region for each NFET and PFET device.

5. The method as claimed in claim 4, wherein said step d) of forming thin disposable spacers comprises:
   blanket depositing a thin conformal layer of dielectric material by a chemical vapor deposition (CVD) process over each of the respective devices;
   covering only the NFET device with a resist material;
   performing a reactive ion etch (RIE) on the PFET device to form the thin disposable spacers on said PFET device, wherein said thin conformal layer of dielectric material is removed from atop the ReOx layer at the PFET device as a result of said RIE.

6. The method as claimed in claim 1, wherein a thickness of said UTSOI layer ranges between 10 Å to about 300 Å.

7. The method as claimed in claim 1, further comprising forming respective p-well and n-well structures in respective UTSOI regions for respective NFET and PFET devices.

8. The method as claimed in claim 1, wherein said epitaxially grown embedded extensions include a Si-containing material.

9. The method as claimed in claim 8, wherein said Si-containing material comprises SiGe material.

10. The method as claimed in claim 1, wherein said step g) of depositing a dielectric material includes depositing an SiN material by LPCVD.

11. The method as claimed in claim 1, wherein said step j) of removing said thick disposable sidewall spacers comprises performing a RIE.

12. The method as claimed in claim 1, wherein said step i) of forming RSD includes epitaxially growing said raised source/drain (RSD) structures on top of respective epitaxially grown embedded semiconductor extensions.

13. The method as claimed in claim 12, wherein said epitaxially grown raised source/drain (RSD) structures comprise a Si-containing material.

* * * * *